(12) United States Patent
Klem et al.

(10) Patent No.: US 8,723,161 B1
(45) Date of Patent: May 13, 2014

(54) TWO-COLOR INFRARED DETECTOR

(75) Inventors: John F. Klem, Albuquerque, NM (US); Jin K. Kim, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 249 days.

(21) Appl. No.: 13/352,098

(22) Filed: Jan. 17, 2012

(51) Int. Cl.
*H01L 31/00* (2006.01)

(52) U.S. Cl.
USPC ............... 257/15; 257/18; 257/214; 257/749; 257/E31.001; 257/E31.107

(58) Field of Classification Search
CPC . H01L 31/02016; H01L 31/109; H01L 31/11; H01L 31/065
USPC ...................... 257/15, 18, 214, 749, E31.001, 257/E31.107, E31.054, E31.093, E29.072, 257/E27.118, E27.122, E27.138, E25.004
See application file for complete search history.

(56) References Cited

U.S. PATENT DOCUMENTS

| | | | |
|---|---|---|---|
| 2009/0256231 A1 | 10/2009 | Klipstein | |
| 2013/0146998 A1* | 6/2013 | Ting et al. | 257/431 |

OTHER PUBLICATIONS

Krijn, M P C M, *Heterojunction band offsets and effective masses in III-V quaternary alloy*, Philips Research Laboratories, The Netherlands, Apr. 30, 1990, Semicond. Sci. Technol. 6, pp. 27-31.

Maimon, S. et al., *nBn detector, an infrared detector with reduced dark current and higher operating temperature*, Institute of Optics, University of Rochester, NY, Oct. 10, 2006, Applied Physics Letters 89, 151109 (3 pages).

Plis E. et al., *nBn Based Infrared Detectors Using Type-II InAs/(In,Ga)Sb Superlattices*, Center for High Technology Materials, NM, Infrared Technology and Applications XXXIV, Proc. of SPIE vol. 6940 69400E, 2008 (10 pages).

Klem, J.F. et al., *Mesa-isolated inGaAs photodetectors with low dark current*, Sandia National Laboratories, Albuquerque, NM, Jul. 23, 2009, Applied Physics Letters 95, 031112, American Institute of Physics (3 pages).

* cited by examiner

*Primary Examiner* — Yasser A Abdelaziez
(74) *Attorney, Agent, or Firm* — Martin I. Finston (57) ABSTRACT

A two-color detector includes a first absorber layer. The first absorber layer exhibits a first valence band energy characterized by a first valence band energy function. A barrier layer adjoins the first absorber layer at a first interface. The barrier layer exhibits a second valence band energy characterized by a second valence band energy function. The barrier layer also adjoins a second absorber layer at a second interface. The second absorber layer exhibits a third valence band energy characterized by a third valence band energy function. The first and second valence band energy functions are substantially functionally or physically continuous at the first interface and the second and third valence band energy functions are substantially functionally or physically continuous at the second interface.

22 Claims, 6 Drawing Sheets

TWO-COLOR INFRARED DETECTOR

STATEMENT REGARDING GOVERNMENT RESEARCH AND DEVELOPMENT

This invention was made with Government support under government contract no. DE-AC04-94AL85000 awarded by the U.S. Department of Energy to Sandia Corporation. The Government has certain rights in the invention, including a paid-up license and the right, in limited circumstances, to require the owner of any patent issuing in this invention to license others on reasonable terms.

BACKGROUND

Photo-detectors are widely used for sensing light radiation. Typically, the photo-detector should be sensitive in some given spectral region (range of optical wavelengths). In some cases, the responsivity of the photo-detector should be constant or at least well defined within some wavelength range. It can also be important to have zero response in some other wavelength range; an example is solar-blind detectors, being sensitive only to short-wavelength ultraviolet light but not to sun light.

The photo-detector should be suitable for some range of optical powers. The maximum detected power can be limited e.g. by damage issues or by a nonlinear response, whereas the minimum power is normally determined by noise. The magnitude of the dynamic range (typically specified as the ratio of maximum and minimum detectable power, e.g. in decibels) is often most important. Some photo-detectors (e.g. photodiodes) can exhibit high linearity over a dynamic range of more than 70 dB.

In some cases, not only a high responsivity, but also a high quantum efficiency is important, as otherwise additional quantum noise is introduced. This applies e.g. to the detection of squeezed states of light, and also affects the photon detection probability of single-photon detectors.

The active area of a photo-detector can be important e.g. when working with strongly divergent beams from laser diodes. For light sources with very high and/or non-constant beam divergence, it is hardly possible to get all the light onto the active area. An integrating sphere may then be used (with appropriate calibration) for measuring the total power.

The detection bandwidth may begin at 0 Hz or some finite frequency, and ends at some maximum frequency which may be limited by internal processes (e.g. the speed of electric carriers in a semiconductor material) or by the involved electronics (e.g. introducing some RC time constants). Some resonant photo-detectors operate only in a narrow frequency range, and can be suitable e.g. for lock-in detection.

BRIEF SUMMARY

Embodiments disclosed herein relate to two-color detectors. In an embodiment, the two-color detector includes a first absorber layer. The first absorber layer exhibits a first valence band energy characterized by a first valence band energy function. A barrier layer adjoins the first absorber layer at a first interface. The barrier layer exhibits a second valence band energy characterized by a second valence band energy function. The barrier layer also adjoins a second absorber layer at a second interface. The second absorber layer exhibits a third valence band energy characterized by a third valence band energy function. The first and second valence band energy functions are substantially functionally or physically continuous at the first interface and the second and third valence band energy functions are substantially functionally or physically continuous at the second interface.

In another embodiment of a two-color detector, the two-color detector includes a first absorber layer comprising $InAs_yP_xSb_{1-x-y}$. The first absorber layer exhibits a first valence band energy characterized by a first valence band energy function. In the embodiment, the two-color detector also includes a second absorber layer comprising $InAs_yP_xSb_{1-x-y}$. The second absorber layer exhibits a second valence band energy characterized by a second valence band energy function. The two-color detector further includes a barrier layer comprising AlAsSb. The barrier layer is located between the first and second absorber layers at a first interface with the first absorber layer and a second interface with the second absorber layer. The barrier layer exhibits a third valence band energy characterized by a third valence band energy function. The first and third valence band energy functions are substantially functionally or physically continuous at the first interface and the second and third valence band energy functions are substantially functionally or physically continuous at the second interface.

Other embodiments disclosed herein relate to the manufacture of a two-color detector with a substantially functionally or physically continuous valence band energy function. In the embodiment, a first absorber layer is provided on a substrate. The first absorber layer has a first material composition exhibiting a first valence band energy characterized by a first valence band energy function. A barrier layer is provided on the first absorber layer to create a first interface. The barrier layer has a second material composition exhibiting a second valence band energy characterized by a second valence band energy function. A second absorber layer is provided on the barrier layer to create a second interface. The second absorber layer has a third material composition exhibiting a third valence band energy characterized by a third valence band energy function. At least one of the first, second, or third material compositions are selected to cause the first and second valence band energy functions to be substantially functionally or physically continuous at the first interface and the second and third valence band energy functions to be substantially functionally or physically continuous at the second interface.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify the above and other advantages and features of embodiments of the present invention, a more particular description of embodiments of the present invention will be rendered by reference to the appended drawings. It is appreciated that these drawings depict only typical embodiments of the invention and are therefore not to be considered limiting of its scope. The embodiments of the present invention will be described and explained with additional specificity and detail through the use of the accompanying drawings in which.

DETAILED DESCRIPTION

Embodiments disclosed herein relate to two-color detectors. In an embodiment, the two-color detector includes a first absorber layer. The first absorber layer exhibits a first valence band energy characterized by a first valence band energy function. A barrier layer adjoins the first absorber layer at a first interface. The barrier layer exhibits a second valence band energy characterized by a second valence band energy function. The barrier layer also adjoins a second absorber layer at a second interface. The second absorber layer exhibits a third valence band energy characterized by a third valence band energy function. The first and second valence band energy functions are substantially functionally or physically continuous at the first interface and the second and third valence band energy functions are substantially functionally or physically continuous at the second interface.

Figure 1A:
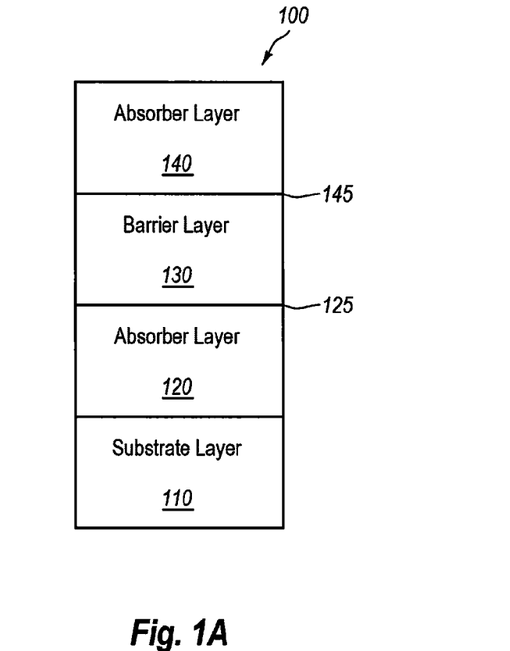
FIG. 1A illustrates an embodiment of a two-color detector.

FIG. 1A illustrates an embodiment of a two-color detector 100, which in some embodiments may be a two-color infrared detector. As illustrated, the two-color detector 100 includes a substrate layer 110, a n-type absorber layer 120, a barrier layer 130, a n-type absorber layer 140, an interface 125 between the absorber layer 120 and the barrier layer 130, and an interface 145 between the absorber layer 140 and the barrier layer 130. It will be appreciated that the two-color detector 100 may also include additional layers such as doping layers and bias contacts that are not illustrated in FIG. 1A. It will also be appreciated that the use of the terms "first" and "second" to describe an element such as an absorber layer is used in the detailed description and in the claims to distinguish one element from another and is not meant to imply sequential order or location unless explicitly stated.

Typically, the absorber layer 120 and the absorber layer 140 have different bandgap materials, with one of the bandgap materials being larger than the other. In operation, light is typically incident on the higher bandgap material absorber layer 120, which will absorb high energy photons in the incident light. Low energy photons will then flow across the barrier layer 130 and be absorbed by the lower bandgap material absorber layer 140.

Biasing and illuminating the two-color detector 100 will cause holes generated in one of the absorber layers to flow across the barrier region to thereby create a photocurrent. For example, by positively biasing the higher bandgap material absorber layer 120, photocurrent generated by illumination at higher wavelengths may be generated. Likewise, by positively biasing the lower bandgap material absorber layer 140, photocurrent generated by illumination of lower wavelengths may be generated. Thus, the two-color detector 100 may be selectively biased to generate photocurrent arising from illumination of different wavelengths.

Figure 1B:
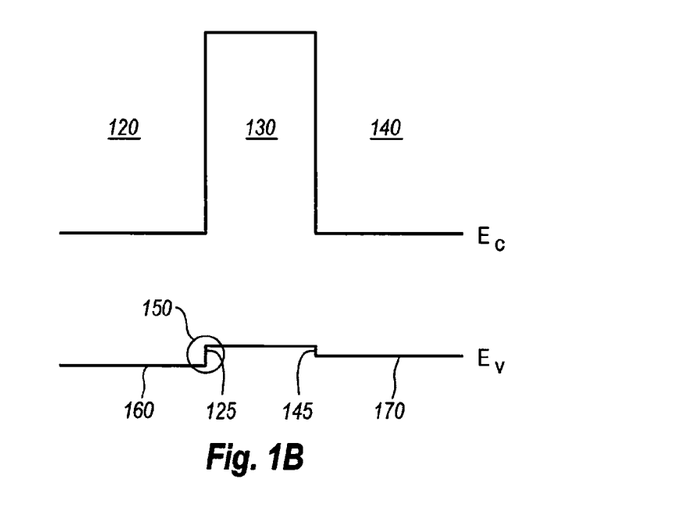
FIG. 1B illustrates a band diagram for the two-color detector of FIG. 1.

FIG. 1B shows a typical band diagram for the two-color detector 100. As shown by FIG. 1B, the valence band energies of the two absorber layers 120 and 140 are typically not the same. That is, the two absorber layers 120 and 140 each have a different valence band energy that is characterized by valence band energy functions 160 and 170 respectively shown in FIG. 1B. This implies that at least one of the two barrier layer/absorber layer interfaces 125 and 145 will have a nonzero valence band energy discontinuity as seen by the circled area 150 at the interface 125. As previously explained, the two-color detector 100 functions by collecting photo-generated holes across both barrier layer/absorber layer interfaces 125 and 145, so a valence band energy discontinuity 150 at either interface acts as an unintentional hole barrier that may impede collection of holes for one bias polarity. In other words, the photo-generated holes may not be able to flow across the discontinuity 150 and will instead pile up at the absorber layer/barrier layer interface 125 and/or 145 with the discontinuity.

In some embodiments, the valence band discontinuity 150 may be narrowed by high doping, allowing tunneling to occur to improve transport, but the high doping may degrade other characteristics of the device such as responsivity, as a result of shortened diffusion length. Alternatively, a high bias may be applied both to narrow the valence band discontinuity 150 and promote thermionic emission over it, but this produces high electric fields in the barrier layer 130, which may promote leakage currents, and also requires higher doping in the barrier layer 130 to avoid absorber layer depletion. Advantageously, the embodiments disclosed herein relate to reducing the unintentional hole barriers caused by the discontinuities 150 at the absorber layer and barrier layer interface without the need for high doping or high bias requirements.

Figure 2A:
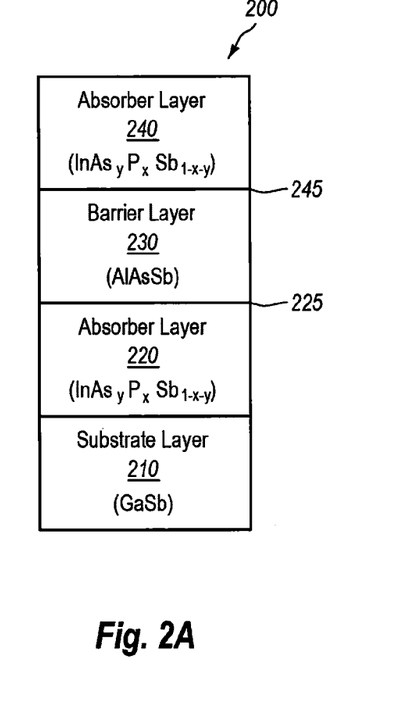
FIG. 2A illustrates an embodiment of a two-color detector.

Turning to FIG. 2A, a two-color detector 200 according to the embodiments disclosed herein is shown. The two-color detector 200 may operate in a manner similar to that of the two-color detector 100 previously described. It will be appreciated that the two-color detector 200 may also include additional layers such as doping layers and bias contacts that are not illustrated in FIG. 2A.

In one embodiment, the two-color detector 200 may have a substrate 210. The substrate 210 may be a GaSb substrate, although other materials may also be chosen as circumstances warrant. An absorber layer 220 may be provided adjacent to the substrate 210. A barrier layer 230 may be provided adjacent to the absorber layer 220 so that an interface 225 is created between the absorber layer 220 and the barrier layer 230. The barrier layer 230 may also be provided adjacent to an absorber layer 240 so that the barrier layer is between the absorber layers 220 and 240. An interface 245 is created between the barrier layer 230 and the absorber layer 240. The absorber layers 220 and 240 may exhibit a valence band energy that is characterized by a valence band energy function. In addition, the barrier layer 230 may also exhibit a valence band energy characterized by a valence band energy function.

In order to minimize any discontinuities such as discontinuity 150 at the interfaces 225 and 245, it is desirable to make the valence band energy functions of the absorber layer 220 and the barrier layer 230 substantially functionally or physically continuous at the interface 225 and to make the valence band energy functions of the barrier layer 230 and the absorber layer 240 substantially functionally or physically continuous at the interface 245. It will be appreciated that in the claims and in the specification that substantially functionally or physically continuous valence band energy functions means that the valence band energy functions of the two layers at an interface will exhibit small or no discontinuities. It will be appreciated that small discontinuities at an interface means that the discontinuities do not necessary have to be zero. For example, substantially functionally or physically continuous valence band energy functions in some embodiments means that any discontinuities in the valence band energy functions at an interface are in a range of 0 eV to about 0.05 eV, in a range of about 0 eV to about 0.045 eV, in a range of about 0 eV to about 0.04 eV, in a range of about 0 eV to about 0.035 eV, in a range of about 0 eV to about 0.03 eV, in a range of about 0 eV to about 0.025 eV, in a range of about 0 eV to about 0.02 eV, in a range of about 0 eV to about 0.015 eV, in a range of about 0 eV to about 0.01 eV, in a range of about 0 eV to about 0.001 eV, in a range of about 0 eV to about 0.002 eV, in a range of about 0 eV to about 0.003 eV, in a range of about 0 eV to about 0.004 eV, in a range of about 0 eV to about 0.005 eV, in a range of about 0 eV to about 0.006 eV, in a range of about 0 eV to about 0.007 eV, in a range of about 0 eV to about 0.008 eV, in a range of about 0 eV to about 0.009 eV, in a range of 0.046 eV to about 0.05 eV, in a range of 0.047 eV to about 0.05 eV, in a range of 0.048 eV to about 0.05 eV, and in a range of 0.049 eV to about 0.05 eV.

In one embodiment, making the valence band energy functions of the absorber layer 220 and the barrier layer 230 substantially physically continuous at the interface 225 and making the valence band energy functions of the barrier layer 230 and the absorber layer 240 substantially physically continuous at the interface 245 is accomplished by selecting a material system for the absorber layers 220 and 240 where the natural valence band energy is substantially constant and is substantially independent of material bandgap. In some embodiments, such material system may include group III-V quaternary alloys that include substantially constant valence band energy functions.

For example, in one embodiment, the absorber layer 220 may be composed of a first group III-V quaternary alloy and the absorber layer 240 may be composed of a second group III-V quaternary alloy. In other embodiments, the absorber layers 220 and 240 may be composed of the same group III-V quaternary alloy.

In one specific embodiment, as illustrated in FIG. 2A, the group III-V quaternary alloy may be $InAs_yP_xSb_{1-x-y}$. This alloy has a bandgap spanning approximately 0.3 to 0.6 electron volts (eV) (4.2–2.0 μm) at room temperature, with minimal valence band energy variation. Over this bandgap range, the valence band energy varies by only approximately 60 meV.

In such embodiment, the composition of the $InAs_yP_xSb_{1-x-y}$ material may be latticed matched to the GaSb substrate previously described. Within this material system and with the relation between the compositional parameters being constrained to keep the lattice-matching, the compositional parameters of the $InAs_yP_xSb_{1-x-y}$ absorber layers 220 and 240 may be adjusted to provide a desired bandgap for a desired detector cutoff wavelength for each absorber layer. Advantageously, as previously mentioned, the natural valence band energy of $InAs_yP_xSb_{1-x-y}$ is substantially constant and is independent of material bandgap. That is, as the compositional parameters of the $InAs_yP_xSb_{1-x-y}$ absorber layers 220 and 240 are adjusted for the desired bandgap, the valence band energy remains substantially constant.

In some embodiments, the barrier layer 230 may be composed of various ternary group III-V materials. In the specific embodiment of FIG. 2A, the barrier layer 230 may be composed of AlAsSb.

Figure 3:
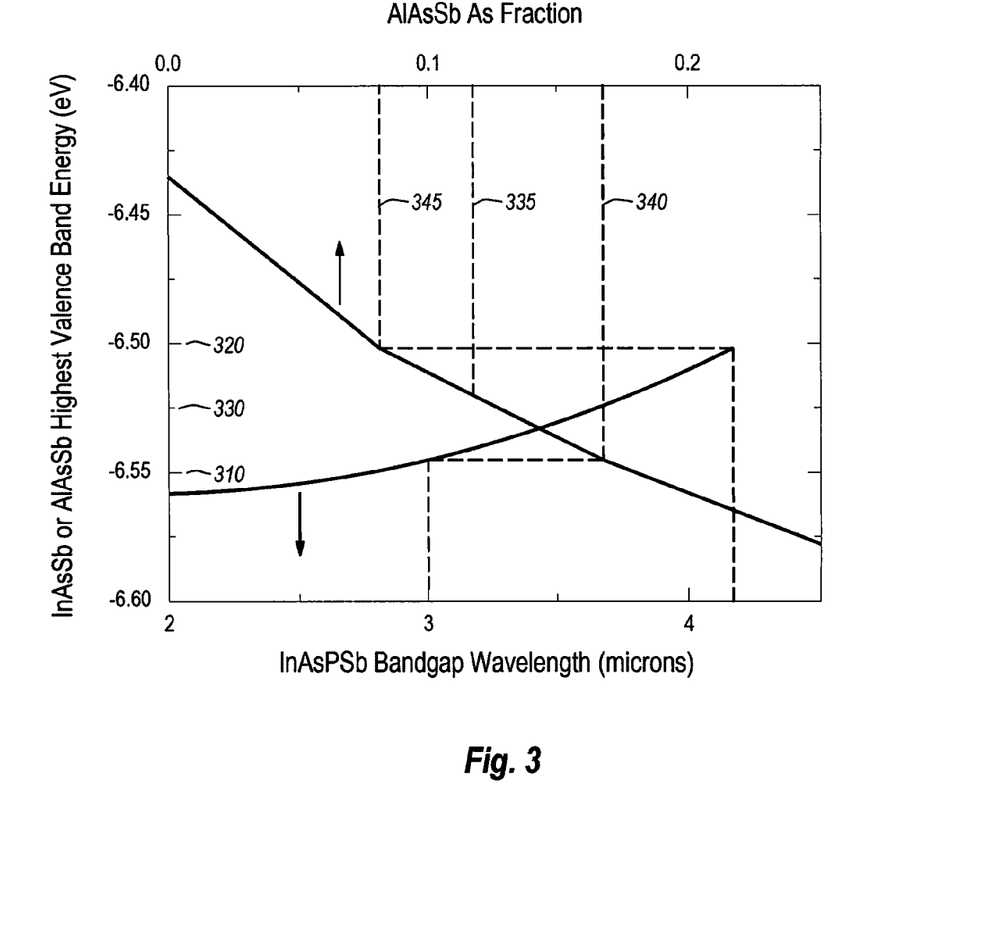
FIG. 3 illustrates a plot showing material parameters for the two-color detector of FIG. 2A.

Attention is now given to FIG. 3, which illustrates a plot showing InAsPSb valence band energy versus InAsPSb bandgap wavelength in microns; and AlAsSb valence band energy (eV) versus the As fraction of AlAsSb for the two-color detector 200. In one specific embodiment, the absorber layer 220 may be configured for 4.2 micron operation and the absorber layer 240 may be configured for 3 micron operation. In this case, the absorber layer 240 may be made with an $InAs_yP_xSb_{1-x-y}$ alloy having a valence band energy of about −6.55 eV as denoted at 310. The absorber layer 220 may be made with an $InAs_yP_xSb_{1-x-y}$ alloy having a valence band energy of about −6.50 eV as denoted at 320. There is a relatively small difference of about 0.05 eV between these. The barrier layer 230 may then be selected to have an AlAsSb composition with a valence band energy between −6.55 eV and −6.50 eV.

Accordingly, providing the absorber layer 220 and the absorber layer 240 with an $InAs_yP_xSb_{1-x-y}$ composition with a similar valence band energy and providing a barrier layer 230 with a AlAsSb composition with a valence band energy similar to that of the absorber layers causes the valence band energy functions of the absorber layer 220 and the barrier layer 230 at the interface 225 to be substantially physically continuous. Likewise, the valence band energy functions of the absorber layer 240 and the barrier layer 230 at the interface 245 are substantially physically continuous.

Figure 2B:
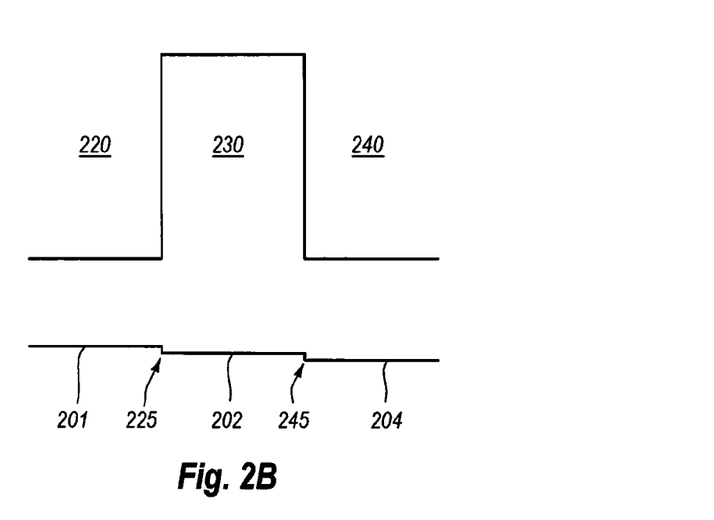
FIG. 2B illustrates a band diagram for an embodiment the two-color detector of FIG. 2A using a specific material composition.

This may be seen in FIG. 2B, where the valence band energy function 201 of absorber layer 220 is substantially physically continuous with the valence band energy band function 202 of the barrier layer 230 at the interface 225. FIG. 2B also shows that the valence band energy function 204 of absorber layer 240 is substantially physically continuous with the valence band energy band function 202 of the barrier layer 230 at the interface 245. In other words, at the interfaces 225 and 245 there may be a substantially zero or there may be only small discontinuities as seen in the figure in the valence band energy functions.

In another embodiment, making the valence band energy functions of the absorber layer 220 and the barrier layer 230 substantially functionally continuous at the interface 225 and making the valence band energy functions of the barrier layer 230 and the absorber layer 240 substantially functionally or physically continuous at the interface 245 is accomplished by including a step transition in the composition of the barrier layer between the first and second interfaces 225 and 245.

Figure 4:
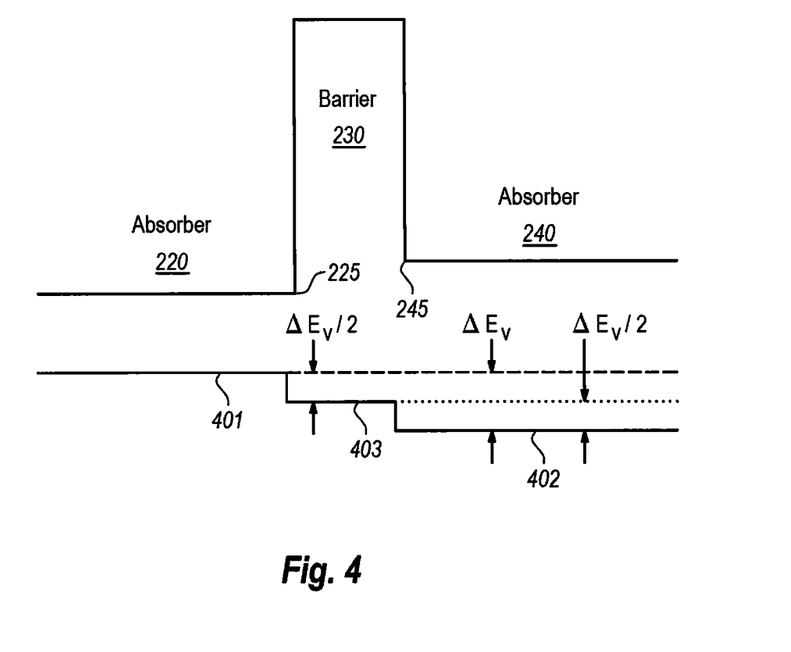
FIG. 4 illustrates a band diagram for an embodiment of the two-color detector of FIG. 2A having a barrier layer with a stepped transition.

Attention is now given to FIG. 4, which illustrates a band diagram of the two-color detector 200 for this embodiment. As shown in FIG. 4, the absorber layer 220 includes a valence band energy function 401 and the absorber layer 240 includes a valence band energy function 402. As also shown, the barrier layer 230 includes a valence band energy function 403. In this embodiment, the composition of the barrier layer 230 may be selected so that the valence band energy function 403 is approximately halfway between the valence band energy functions of 401 and 402.

This results in approximately equal valence band discontinuities of opposite direction at the interfaces 225 and 245. This has the effect of producing discontinuities of approximately one-half of the valence band energy difference between the two absorber layers 220 and 240. In other words, as illustrated, the valence band energy functions 401, 402, and 403 are functionally continuous.

A specific example of the embodiment of FIG. 4 will now be described with reference to the plot of FIG. 3. As previously discussed, the absorber layer 240 may be made with an $InAs_yP_xSb_{1-x-y}$ alloy having a valence band energy of about −6.55 eV and operating at 3 microns as denoted at 310. The absorber layer 220 may be made with an $InAs_yP_xSb_{1-x-y}$ alloy having a valence band energy of about −6.50 eV and operating at 4.2 microns as denoted at 320. Accordingly, the material composition of the barrier layer would need to be selected so that the valence band energy is −6.525 eV, which is half way between −6.55 eV and −6.50 eV and is denoted at 330. Following plot line 335, it is shown that selecting a barrier layer composition of AlAsSb having an As group V mole fraction of about 0.12 will meet the −6.525 eV requirement and allow for substantially functionally continuous valence band energy functions as previously described.

In a further embodiment, making the valence band energy functions of the absorber layer 220 and the barrier layer 230 substantially physically continuous at the interface 225 and making the valence band energy functions of the barrier layer 230 and the absorber layer 240 substantially physically continuous at the interface 245 is accomplished by having a composition of the barrier layer 230 that includes a graded transition from the first interface to the second interface. The composition of the graded transition should be selected so that the valence band energy function of the barrier layer produced by a first barrier layer composition at the first interface is substantially equal to the valence band energy function of the first absorber and the valence band energy of the barrier layer produced by a second barrier layer composition at the second interface is substantially equal to the valence band energy of the second absorber layer.

Figure 5:
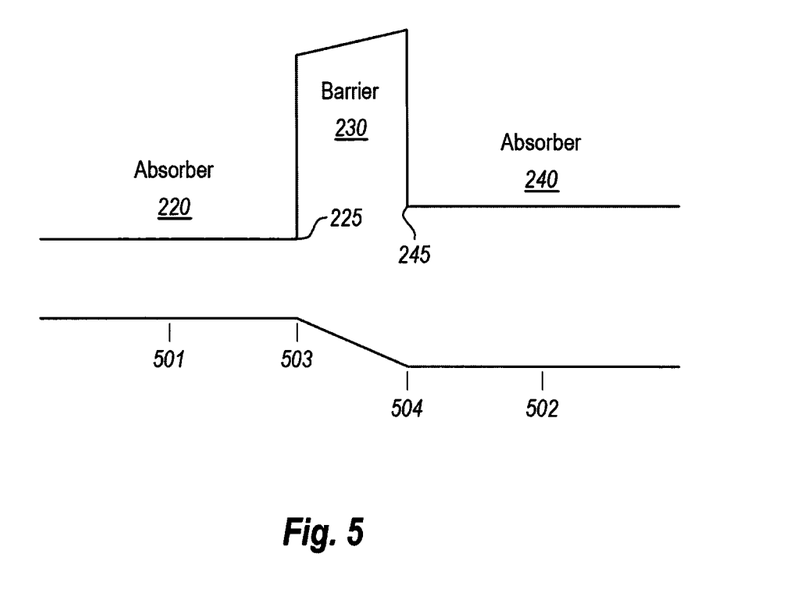
FIG. 5 illustrates a band diagram for an embodiment of the two-color detector of FIG. 2A having a barrier layer with a graded transition.

Attention is now given to FIG. 5, which illustrates a band diagram of the two-color detector 200 for this embodiment. As shown in FIG. 5, the absorber layer 220 includes a valence band energy function 501 and the absorber layer 240 includes a valence band energy function 502. As also shown, the barrier layer 230 has a graded composition that is graded from the interface 225 to the interface 245. In some embodiments, the composition of the barrier layer 230 may be linearly graded while in other embodiments the composition of the barrier layer 230 may be graded in a manner other than linearly.

FIG. 5 further shows that at the interface 225, the barrier layer 230 has a valence band energy function 503 caused by the material composition of the barrier layer 230 at the interface 225. In addition, at the interface 245, the barrier layer 230 has a valence band energy function 504 caused by the material composition of the barrier layer 230 at the interface 245. In order to ensure that the valence band energy functions 501 and 503 are substantially continuous, the material composition of the barrier layer 230 at the interface 225 should be selected to ensure that the valence band energy function 503 is substantially equal to the valence band energy function 501.

Likewise, the material composition of the barrier layer 230 at the interface 245 should be selected to ensure that the valence band energy function 504 is substantially equal to the valence band energy function 502. This will in turn help to ensure that the valence band energy functions of the absorber layer 220 and the barrier layer 230 are substantially physically continuous at the interface 225 and the valence band energy functions of the barrier layer 230 and the absorber layer 240 are substantially physically continuous at the interface 245.

A specific example of the embodiment of FIG. 5 will now be described with reference to the plot of FIG. 3. In this embodiment, the absorber layer 240 may be made with an $InAs_yP_xSb_{1-x-y}$ alloy having a valence band energy of about −6.55 eV and operating at 3 microns as denoted at 310. The absorber layer 220 may be made with an $InAs_yP_xSb_{1-x-y}$ alloy having a valence band energy of about −6.50 eV and operating at 4.2 microns as denoted at 320. Accordingly, the material composition of the graded barrier layer 230 at the interface 225 would need to be selected so that the valence band energy function 503 is substantially equal to the valence band energy function 501 and the material composition of the graded barrier layer 230 at the interface 245 would need to be selected so that the valence band energy function 504 is substantially equal to the valence band energy function 502. Following plot line 345, it is shown that selecting a barrier layer composition of AlAsSb having an As group V mole fraction of about 0.08 at the interface 225 will cause the valence band energy function 503 to substantially equal to the valence band energy function 501. Likewise, following the plot line 340, it is shown that selecting a barrier layer composition of AlAsSb having an As group V fraction of about 0.17 mole percent at the interface 245 will cause the valence band energy function 504 to substantially equal to the valence band energy function 502. Accordingly, the valence band energy functions 501, 502, 503, and 504 are substantially physically continuous at the interfaces 225 and 245.

Figure 6A:
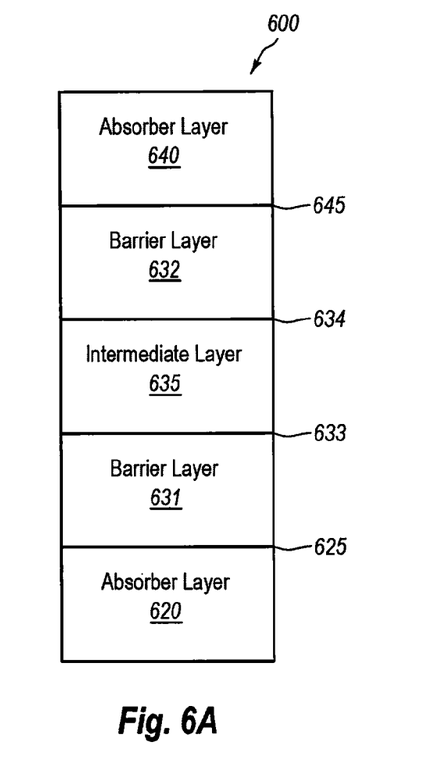
FIG. 6A illustrates an embodiment of a two-color detector having an intermediate layer.

FIG. 6A illustrates an embodiment 600 of a two-color detector 600. The two-color detector 600 includes an absorber layer 620 and an absorber layer 640 that may correspond to the absorber layers 220 and 240 previously described. Two-color detector 600 also includes a barrier layer. However, in this embodiment the barrier layer comprises a first barrier layer 631 that is adjacent to the absorber layer 620 at an interface 625 and a second barrier layer 632 that is adjacent to the absorber layer 640 at an interface 645. In addition, the two-color detector includes an intermediate layer 635 that is placed between the first and second barrier layer 631 and 632, creating an interface 633 and an interface 634. In some embodiments, the first and second barrier layers may be composed of ternary group III-V materials including AlAsSb as previously described. In some embodiments, the intermediate layer 635 may be composed of group III-V quaternary alloys including $InAs_yP_xSb_{1-x-y}$.

Figure 6B:
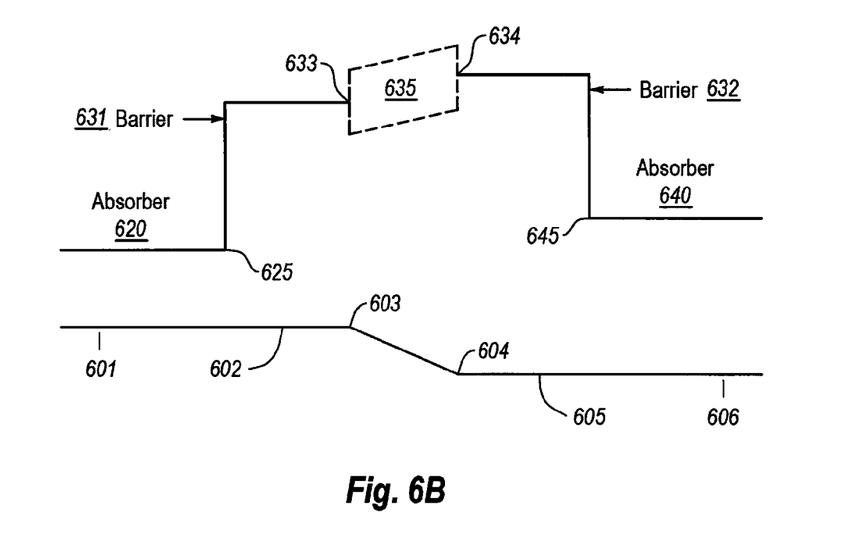
FIG. 6B illustrates a band diagram for the embodiment the two-color detector of FIG. 6A.

FIG. 6B illustrates a band diagram of the two-color detector 600. In order to prevent discontinuities such as discontinuity 150, in one embodiment the composition of the barrier layer 631 may be selected so that the valence energy band function 602 of the barrier layer 631 is substantially equal to the valence energy band function 601 of the absorber layer 620 and is thereby substantially physically continuous. Likewise, the composition of the barrier layer 632 may be selected so that the valence energy band function 605 of the barrier layer 632 is substantially equal to the valence energy band function 606 of the absorber layer 640 and is thereby substantially physically continuous.

In addition, the composition of the intermediate layer 635 may be graded between the interfaces 633 and 634 so that the valence band energy function 603 of the intermediate layer 635 at the interface 633 is substantially equal to the valence band energy function 602 of the barrier layer 631 and the valence band energy function 604 of the intermediate layer 635 at the interface 634 is substantially equal to the valence band energy function 605 of the barrier layer 632. Accordingly, this provides a substantially physically continuous valence band energy function between the intermediate layer 635 and the barrier layers 631 and 632 and between the barrier layers 631 and 632 and the absorber layers 620 and 640. It will be noted that the conduction band position of the intermediate layer 635 is not important. In addition, for n-type absorbers, the intermediate layer 635 may be p-type; or it may be n-type if the hole diffusion length is greater than the thickness of intermediate layer 635.

A specific example of the embodiment of FIG. 6A and 6B will now be described with reference to the plot of FIG. 3. In this example, the absorber layer 640 may be made with an $InAs_yP_xSb_{1-x-y}$ alloy having a valence band energy of about −6.55 eV and operating at 3 microns as denoted at 310. The absorber layer 620 may be made with an $InAs_yP_xSb_{1-x-y}$ alloy having a valence band energy of about −6.50 eV and operating at 4.2 microns as denoted at 320. In such case, the composition of the barrier layer 631 would comprise AlAsSb having an As group V fraction of about 0.08 mole percent as shown by plot line 345 and the composition of the barrier layer 632 would comprise an As group V fraction of about 0.17 mole percent as shown by plot line 340. The composition of the intermediate layer 635 would comprise an $InAs_yP_xSb_{1-x-y}$ layer having a bandgap cutoff of 4.2 microns at the interface 633 with the first barrier layer 631 and a bandgap cutoff of 3 microns at the interface 634 with the second barrier layer 632.

Figure 7A:
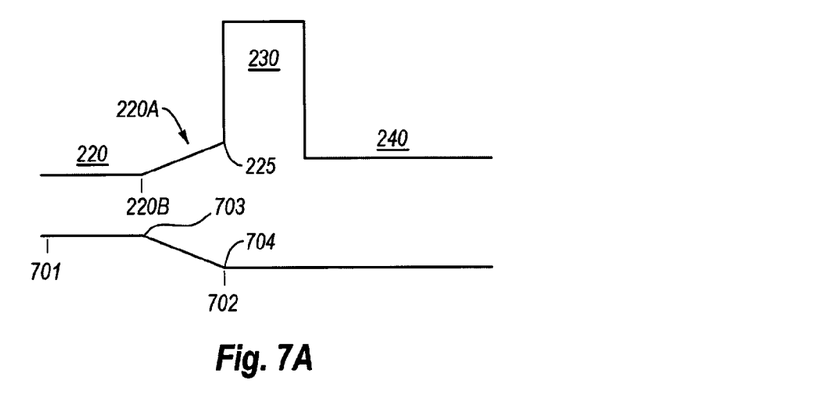
FIG. 7A illustrates a band diagram for an embodiment of the two-color detector of FIG. 2A having an absorber layer with a graded transition.
Figure 7B:
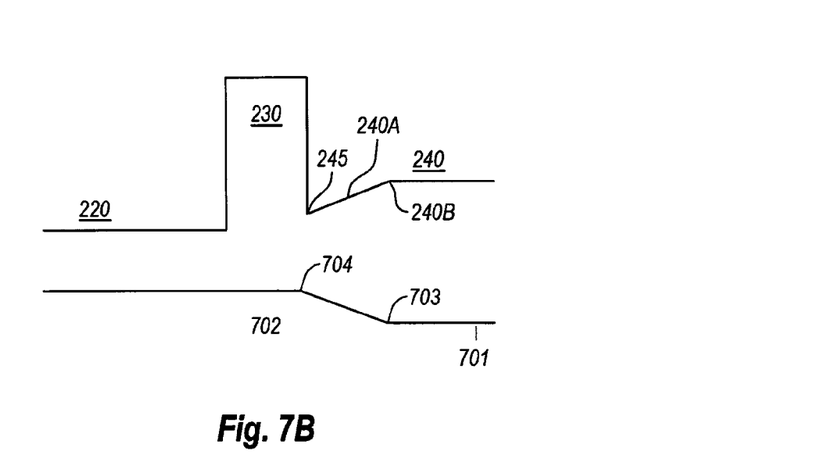
FIG. 7B illustrates a band diagram for an embodiment of the two-color detector of FIG. 2A having the other absorber layer with a graded transition.
Figure 7C:
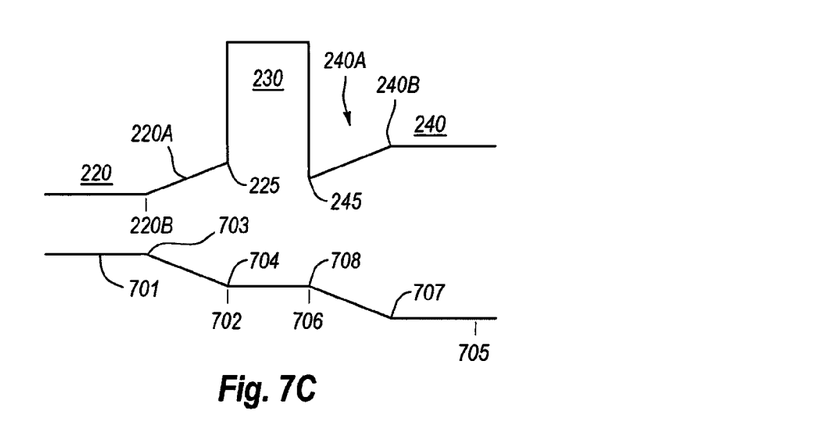
FIG. 7C illustrates a band diagram for an embodiment of the two-color detector of FIG. 2A having both absorber layers with a graded transition.

FIGS. 7A-7C illustrate band diagrams of further embodiments for making the valence band energy functions substantially physically continuous at the barrier layer/absorber layer interface. In these embodiments, the composition of absorber layer 220, absorber layer 240, or both may be graded so that the valence band energy functions at the interfaces 225 and/or 245 are substantially physically continuous.

For example, FIG. 7A illustrates that a first portion of the absorber layer 220 has a valence band energy function 701 and that the barrier layer 230 has a valence band energy function 702 at the interface 225. In order to at least partially ensure a substantially physically continuous valence band energy function at the interface 225, the material composition of a graded portion 220A of the absorber layer 220 should be selected so that a valence band energy function 703 of the portion of the graded portion 220A at an interface 220B with the first portion of the absorber layer 220 is substantially equal to the valence band energy function 701. Likewise, the material composition of the graded portion 220A at the interface 225 should be selected so that a valence band energy function 704 of the portion of the graded portion 220A at the interface 225 is substantially equal to the valence band energy function 702. In some embodiments, the graded portion 220A may comprise a graded $InAs_yP_xSb_{1-x-y}$ layer, although other group III-V quaternary materials may also be used.

FIG. 7B illustrates that a first portion of the absorber layer 240 has a valence band energy function 701 and that the barrier layer 230 has a valence band energy function 702 at the interface 245. In order to at least partially ensure a substantially physically continuous valence band energy function at the interface 245, the material composition of a graded portion 240A of the absorber layer 240 should be selected so that a valence band energy function 703 of the portion of the graded portion 240A at an interface 240B with the first por-
tion of the absorber layer 240 is substantially equal to the valence band energy function 701. Likewise, the material composition of the graded portion 240A at the interface 245 should be selected so that a valence band energy function 704 of the portion of the graded portion 240A at the interface 245 is substantially equal to the valence band energy function 702. In some embodiments, the graded portion 240A may comprise a graded $InAs_yP_xSb_{1-x-y}$ layer, although other group III-V quaternary materials may also be used.

FIG. 7C illustrates that a first portion of the absorber layer 220 has a valence band energy function 701 and that the barrier layer 230 has a valence band energy function 702 at the interface 225. The material composition of a graded portion 220A of the absorber layer 220 should be selected so that a valence band energy function 703 of the portion of the graded portion 220A at an interface 220B with the first portion of the absorber layer 220 is substantially equal to the valence band energy function 701. Likewise, the material composition of the graded portion 220A at the interface 225 should be selected so that a valence band energy function 704 of the portion of the graded portion 220A at the interface 225 is substantially equal to the valence band energy function 702.

FIG. 7C also illustrates that that a first portion of the absorber layer 240 has a valence band energy function 705 and that the barrier layer 230 has a valence band energy function 706 at the interface 245. The material composition of a graded portion 240A of the absorber layer 240 should be selected so that a valence band energy function 707 of the portion of the graded portion 240A at an interface 240B with the first portion of the absorber layer 240 is substantially equal to the valence band energy function 705. Likewise, the material composition of the graded portion 240A at the interface 245 should be selected so that a valence band energy function 708 of the portion of the graded portion 240A at the interface 245 is substantially equal to the valence band energy function 706. In some embodiments, the graded portions 220A and 240A may comprise a graded $InAs_yP_xSb_{1-x-y}$ layer, although other group III-V quaternary materials may also be used.

Accordingly, the embodiments disclosed herein relate to substantially reducing unintentional hole barriers caused by discontinuities at an absorber layer and barrier layer interface without the need for high doping or high bias requirements. Rather, the material compositions of the absorber layers and barrier layers are selected in the various ways described herein so that a valence band energy function of the absorber layer and the valence band energy function of the barrier layer are substantially functionally or physically continuous at the absorber layer and barrier layer interface.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A two-color detector comprising:
a first absorber layer exhibiting a first valence band energy characterized by a first valence band energy function, said first absorber layer comprising a group III-V quaternary alloy;
a barrier layer exhibiting a second valence band energy characterized by a second valence band energy function, the barrier layer adjoining the first absorber layer at a first interface; and a second absorber layer exhibiting a third valence band energy characterized by a third valence band energy function, the barrier layer adjoining the second absorber layer at a second interface such that the barrier layer is between the first and second absorber layers, said second absorber layer comprising a group III-V quaternary alloy;

wherein the first and second valence band energy functions are substantially functionally or physically continuous at the first interface and the second and third valence band energy functions are substantially functionally or physically continuous at the second interface.

2. The two-color detector in accordance with claim 1, wherein the first and second valence band energy functions are substantially functionally or physically continuous at the first interface and the second and third valence band energy functions are substantially functionally or physically continuous at the second interface by having first and second absorber layers that comprise a group III-V quaternary alloy that includes approximately constant valence band energy.

3. The two-color detector in accordance with claim 2, wherein the group III-V quaternary alloy is $InAs_yP_xSb_{1-x-y}$.

4. The two-color detector in accordance with claim 2, wherein the group III-V quaternary alloy has a bandgap spanning approximately 0.3 to 0.6 electron volts (eV).

5. The two-color detector in accordance with claim 1, wherein the first and second valence band energy functions are substantially functionally or physically continuous at the first interface and the second and third valence band energy functions are substantially functionally or physically continuous at the second interface by having a composition of the barrier layer that includes a step transition between the first interface of the first absorber layer and the barrier layer and the second interface of the second absorber layer and barrier layer.

6. The two-color detector in accordance with claim 5, wherein the barrier layer comprises AlAsSb.

7. The two-color detector in accordance with claim 6, where the AlAsSb barrier layer has a As group V fraction of about 12 mole percent.

8. The two-color detector in accordance with claim 1, wherein the first and second valence band energy functions are substantially functionally or physically continuous at the first interface and the second and third valence band energy functions are substantially functionally or physically continuous at the second interface by having a composition of the barrier layer that includes a graded transition from the first interface to the second interface such that the valence band energy function of the barrier layer produced by a first barrier layer composition at the first interface equals the valence band energy function of the first absorber and the valence band energy of the barrier layer produced by a second barrier layer composition at the second interface equals the valence band energy of the second absorber layer.

9. The two-color detector in accordance with claim 8, wherein the graded barrier layer comprises AlAsSb having an As group V fraction of about 8 mole percent at the first barrier layer composition and an As group V fraction of about 17 mole percent at the second barrier layer composition.

10. The two-color detector in accordance with claim 1, wherein the barrier layer comprises a first barrier layer adjacent to the first absorber layer and a second barrier layer adjacent to the second barrier layer, the two-color detector further comprising:

an intermediate layer placed between the first barrier layer and the second barrier layer, the intermediate layer having a composition that results in a substantially functionally or physically continuous valance band energy function between the intermediate layer and the first and second barrier layers.

11. The two-color detector in accordance with claim 1, wherein the first and second valence band energy functions are substantially functionally or physically continuous at the first interface and the second and third valence band energy functions are substantially functionally or physically continuous at the second interface by having a composition of at least one of the first and second absorber layers that includes a graded transition to the barrier layer so as to match the valence band energy of the barrier layer.

12. A method for manufacturing a two-color detector with a substantially functionally or physically continuous valence band energy function comprising:

providing a first absorber layer on a substrate, the first absorber layer having a first material composition comprising a group III-V quaternary alloy and exhibiting a first valence band energy characterized by a first valence band energy function;

providing a barrier layer on the first absorber layer to thereby create a first interface, the barrier layer having a second material composition exhibiting a second valence band energy characterized by a second valence band energy function;

providing a second absorber layer on the barrier layer to thereby create a second interface, the second absorber layer having a third material composition comprising a group III-V quaternary alloy and exhibiting a third valence band energy characterized by a third valence band energy function, wherein at least one of the first, second, and third material compositions are selected to cause the first and second valence band energy functions to be substantially functionally or physically continuous at the first interface and the second and third valence band energy functions to be substantially functionally or physically continuous at the second interface.

13. The method in accordance with claim 12, further comprising:

selecting the first and third material composition to be from a group III-V quaternary alloy that includes an approximately constant valance band energy function, the group III-V quaternary alloy including $InAs_yP_xSb_{1-x-y}$.

14. The method in accordance with claim 12, further comprising:

selecting the second material composition to include a step transition between the first interface of the first absorber layer and the barrier layer and the second interface of the second absorber layer and the barrier layer, the second material including AlAsSb.

15. The method in accordance with claim 12, further comprising:

selecting the second material composition to include a graded transition such that the valence band energy function of the barrier layer produced by a first barrier layer composition at the first interface equals the valence band energy function of the first absorber and the valence band energy function of the barrier layer produced by a second barrier layer composition at the second interface equals the valence band energy function of the second absorber layer.

16. The method in accordance with claim 12, wherein the barrier layer comprises a first barrier layer adjacent to the first absorber layer and a second barrier layer adjacent to the second absorber layer, the method further comprising:

providing an intermediate layer between the first barrier layer and the second barrier layer, the intermediate layer having a composition that results in a substantially functionally or physically continuous valence band energy function between the intermediate layer and the first and second barrier layers.

17. A two-color detector comprising:
a first absorber layer comprising $InAs_yP_xSb_{1-x-y}$, the first absorber layer exhibiting a first valence band energy characterized by a first valence band energy function;
a second absorber layer comprising $InAs_yP_xSb_{1-x-y}$, the second absorber layer exhibiting a second valence band energy characterized by a second valence band energy function; and
a barrier layer located between the first and second absorber layers at a first interface with the first absorber layer and a second interface with the second absorber layer, the barrier layer comprising AlAsSb, the barrier layer exhibiting a third valence band energy characterized by a third valence band energy function;
wherein the first and third valence band energy functions are substantially functionally or physically continuous at the first interface and the second and third valence band energy functions are substantially functionally or physically continuous at the second interface.

18. The two-color detector in accordance with claim 17, further comprising:
a GaSb substrate on which the first absorber layer is located.

19. The two-color detector in accordance with claim 17, wherein the first and third valence band energy functions are substantially functionally or physically continuous at the first interface and the second and third valence band energy functions are substantially functionally or physically continuous at the second interface by having a composition of the barrier layer that includes a graded transition from the first interface to the second interface such that the valence band energy function of the barrier layer produced by a first barrier layer composition at the first interface substantially equals the valence band energy function of the first absorber and the valence band energy of the barrier layer produced by a second barrier layer composition at the second interface substantially equals the valence band energy of the second absorber layer.

20. The two-color detector in accordance with claim 17, wherein the first and third valence band energy functions are substantially functionally or physically continuous at the first interface and the second and third valence band energy functions are substantially functionally or physically continuous at the second interface by having a composition of the barrier layer that includes a step transition between the first interface of the first absorber layer and the barrier layer and the second interface of the second absorber layer and barrier layer.

21. The two-color detector in accordance with claim 1, wherein the barrier layer comprises a group III-V ternary alloy.

22. The two-color detector in accordance with claim 10, wherein the first barrier layer comprises a group III-V ternary alloy, the second barrier layer comprises a group III-V ternary alloy, and the intermediate layer comprises a group III-V quaternary alloy.

* * * * *